(12) United States Patent  
Boselli

(10) Patent No.: US 7,728,349 B2
(45) Date of Patent: Jun. 1, 2010

(54) LOW CAPACITANCE SCR WITH TRIGGER ELEMENT

(75) Inventor: Gianluca Boselli, Farmers Branch, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/247,452

(22) Filed: Oct. 11, 2005

(65) Prior Publication Data

US 2007/0090392 A1 Apr. 26, 2007

(51) Int. Cl.
*H01L 29/74* (2006.01)
(52) U.S. Cl. ............... 257/111; 257/107; 257/E29.113
(58) Field of Classification Search ........... 257/107, 257/355, 356, 357, E27.052, 111, E29.113
See application file for complete search history.

(56) References Cited

U.S. PATENT DOCUMENTS

| | | | |
|---|---|---|---|
| 5,012,317 A | | 4/1991 | Rountre |
| 5,307,462 A | | 4/1994 | Hastings |
| 5,734,543 A | * | 3/1998 | Turner .................. 361/154 |
| 5,856,214 A | * | 1/1999 | Yu ....................... 438/133 |
| 6,016,002 A | * | 1/2000 | Chen et al. ............. 257/546 |
| 6,764,892 B2 | | 7/2004 | Kunz et al. |
| 6,822,294 B1 | | 11/2004 | Vashchenko et al. |
| 6,876,957 B1 | | 4/2005 | Stewart |
| 6,909,149 B2 | | 6/2005 | Russ et al. |
| 6,911,679 B1 | | 6/2005 | Vashchenko et al. |
| 6,919,604 B2 | | 7/2005 | Lai et al. |
| 7,064,393 B2 | * | 6/2006 | Mergens et al. ......... 257/360 |
| 2002/0053704 A1 | | 5/2002 | Avery et al. |
| 2003/0218841 A1 | * | 11/2003 | Kodama ................ 361/56 |
| 2004/0136127 A1 | * | 7/2004 | Kodama et al. .......... 361/56 |

(Continued)

OTHER PUBLICATIONS

Jang et al. "Novel diode-chain triggering SCR circuits for ESD protection." Solid-State Electronics, 44 (2000) 1297-1303.*

(Continued)

*Primary Examiner*—Allan R. Wilson
(74) *Attorney, Agent, or Firm*—Warren L. Franz; Wade J. Brady, III; Frederick J. Telecky, Jr.

(57) ABSTRACT

A silicon rectifier semiconductor device with selectable trigger and holding voltages includes a trigger element. A first well region of a first conductivity type formed within a semiconductor body. A first region of the first conductivity type is formed within the first well region. A second region of a second conductivity type is formed with the first well region. A second well region having the second conductivity type is formed within the semiconductor body adjacent the first well region. A third region of the first conductivity type is formed within the second well region. A fourth region of the second conductivity type is formed within the second well region. The trigger element is connected to the first region and alters a base trigger voltage and a base holding voltage into an altered trigger voltage and an altered holding voltage. A first terminal or pad is connected to the second region. A second terminal is connected to the third region, the fourth region, and the trigger element. In operation, the first terminal conducts current to the second terminal during a low impedance state in response to the altered trigger voltage being applied to the first terminal.

17 Claims, 8 Drawing Sheets

U.S. PATENT DOCUMENTS

2004/0201033 A1  10/2004  Russ et al.
2004/0217425 A1  11/2004  Brodsky et al.

OTHER PUBLICATIONS

Mergens et al. "Advanced SCR ESD Protection Circuits for CMOS/SOI Nanotechnologies." Presented Paper at CICC Custom Integrated Circuits Conference, San Jose, CA (Sep. 18-21, 2005).*

"Diode-Triggered SCR (DTSCR) for RF-ESD Protection of BiCMOS SiGe HBTs and CMOS Ultra-Thin Gate Oxides", Markus P.J. Mergens, Christian C. Russ, Koes G. Verhaege, John Armer, Phillip C. Jozwiak, Russ Mohn, Bart Keppens, and Con Son Trinh, IEEE, Dec. 2003 pp. 21.3.1-21.3.4.

"ESD: A Pervasive Reliability Concern for IC Technologies", Charkava Duvvury and Ajith Amerasekera, IEEE, May 1993, pp. 690-702.

* cited by examiner

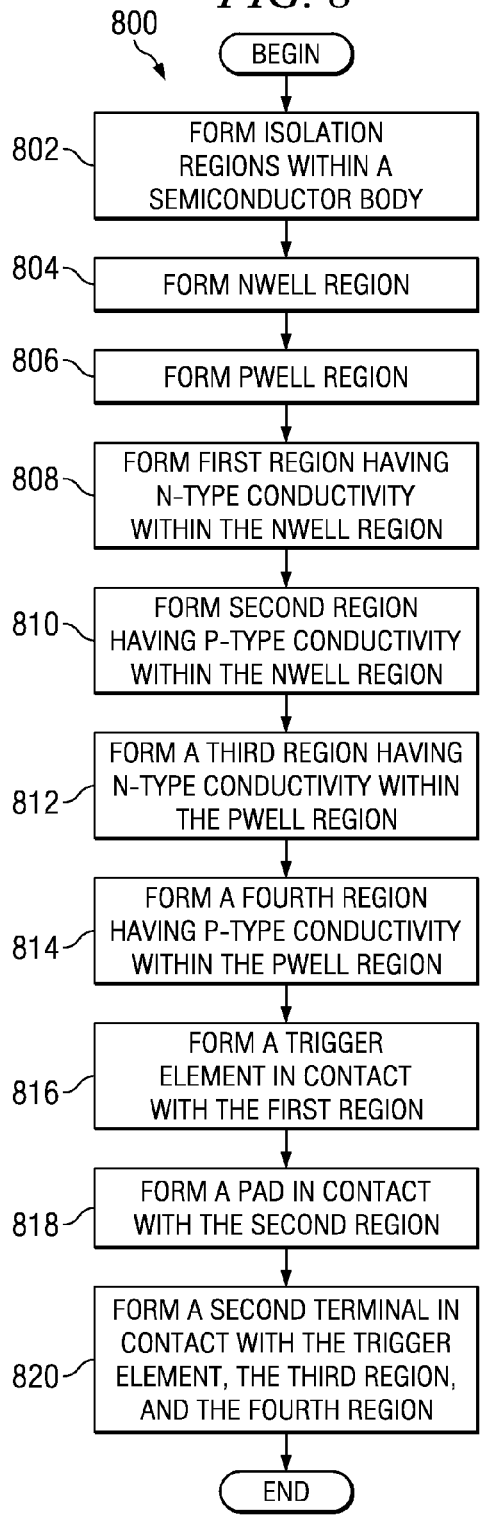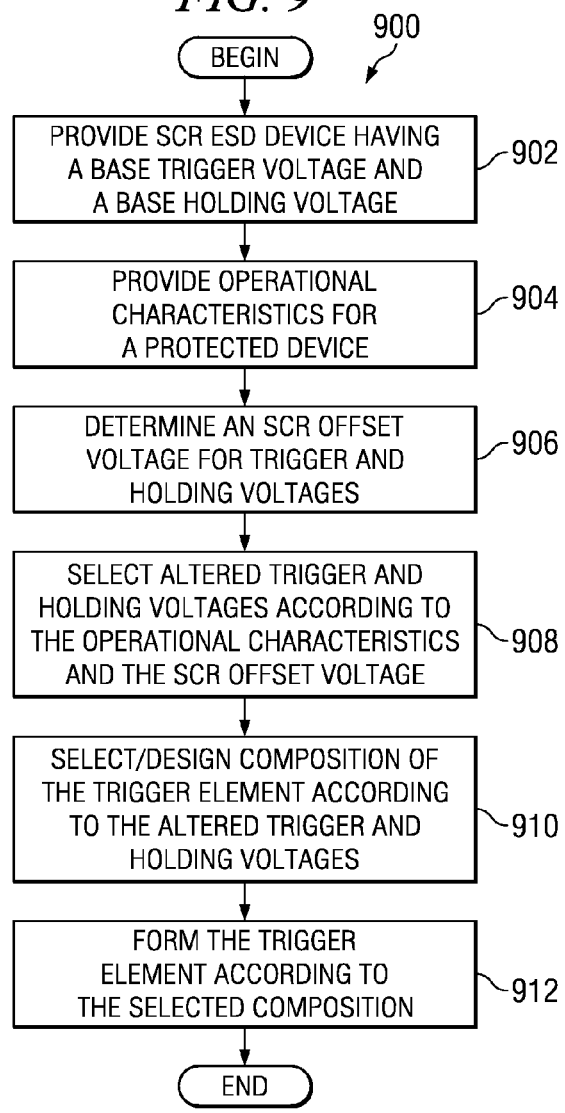

LOW CAPACITANCE SCR WITH TRIGGER ELEMENT

FIELD OF INVENTION

The present invention relates generally to semiconductor devices and more particularly semiconductor to silicon controlled rectifier (SCR) devices and methods of fabrication and operation that incorporate a trigger element.

BACKGROUND OF THE INVENTION

Integrated circuits (ICs) may be severely damaged by electrostatic discharge (ESD) events, which cause relatively large voltages to be applied across devices. The applied voltages from the ESD events are generally larger or greater than operational voltages typically seen and can damage the devices when these events occur.

A typical source of ESD exposure to ICs is from the charged human body ("Human Body Model", HBM). The discharge of the human body generates peak currents of several amperes to the IC for about 100 ns. A second source of ESD is from metallic objects ("machine model", MM), which can generate transients with significantly higher rise times than the HBM ESD source. A third source is described by the "charged device model" (CDM), in which the IC itself becomes charged and discharges to ground in the opposite direction than the HBM and MM ESD sources.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

Some common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

A dominant failure mechanism, found in the nMOS protection device operating as a parasitic bipolar transistor in snapback conditions, is the onset of second breakdown. The second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

Another common ESD protection scheme employs a silicon controlled rectifier (SCR) as a protection device against ESD wherein the trigger mechanism is avalanche conduction at the interface between the n-well surrounding a portion of the protection device and the p-type substrate. A highly doped region is connected to a parasitic resistor which is then connected to the protected node. The parasitic resistor and heavily doped region at the intersection between the n-well and substrate provide an additional source of current for avalanching at a lower voltage. However, such formed SCR devices are not fast enough for many semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates electrostatic discharge protection while meeting low and/or ultra low capacitance requirements. As a result, high speed operations can be performed without a negative impact on performance. The present invention employs a silicon controlled rectifier (SCR) device with a new configuration and a trigger element. The new configuration permits low and/or ultra low capacitance with high speed operation. Additionally, the new configuration avoids excessively large triggering voltages. The trigger element allows adjustment and/or selection of trigger and holding voltages for the SCR device, for example, according to operational characteristics of a device to be protected.

In accordance with one aspect of the invention, a silicon rectifier semiconductor device with selectable trigger and holding voltages includes a trigger element. A first well region of a first conductivity type formed within a semiconductor body. A first region of the first conductivity type is formed within the first well region. A second region of a second conductivity type is formed with the first well region. A second well region having the second conductivity type is formed within the semiconductor body adjacent the first well region. A third region of the first conductivity type is formed within the second well region. A fourth region of the second conductivity type is formed within the second well region. The trigger element is connected to the first region and alters a base trigger voltage and a base holding voltage into an altered trigger voltage and an altered holding voltage. A first terminal or pad is connected to the second region. A second terminal is connected to the third region, the fourth region, and the trigger element. In operation, the first terminal conducts current to the second terminal during a low impedance state in response to the altered trigger voltage being applied to the first terminal. Other devices and methods are disclosed.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 8 is a flow diagram of a method of fabricating and utilizing an SCR device with a trigger element in accordance with an aspect of the present invention.

FIG. 9 is a method of forming a trigger element employable with an SCR ESD device in accordance with an aspect of the present invention.

DETAILED DESCRIPTION OF THE INVENTION

Figure 1A:
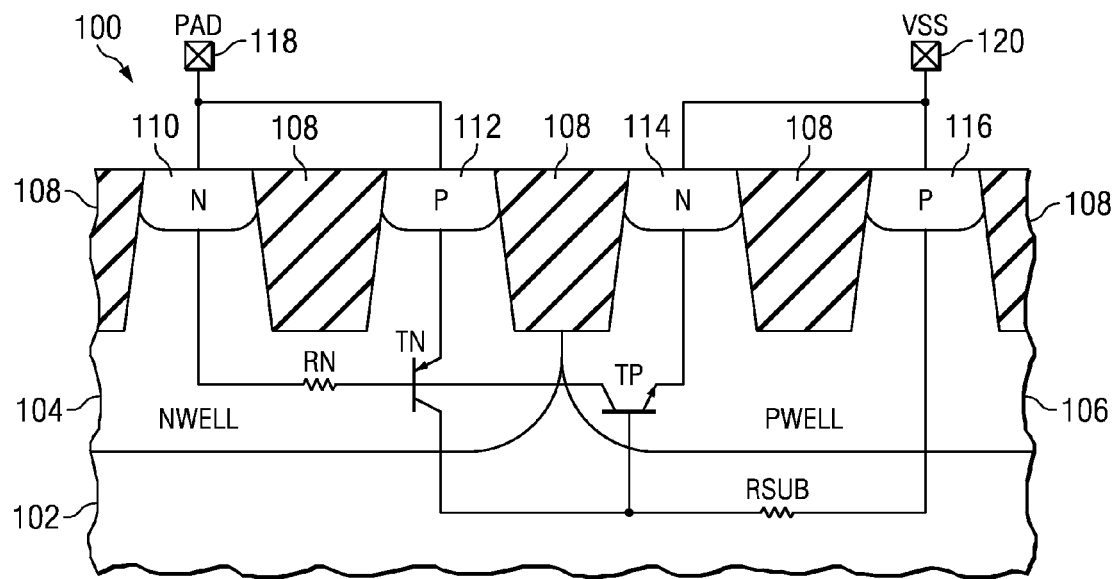
FIG. 1A is a cross sectional view of a conventional silicon controlled rectifier (SCR) device.

One or more implementations of the present invention will now be described with reference to the attached drawings, wherein like reference numerals are used to refer to like elements throughout, and wherein the illustrated structures are not necessarily drawn to scale.

The present invention facilitates electrostatic discharge protection while meeting low and/or ultra low capacitance requirements. As a result, high speed operations can be performed without a negative impact on performance. The present invention employs a silicon controlled rectifier (SCR) device with a new configuration and a trigger element. The new configuration permits low and/or ultra low capacitance with high speed operation. Additionally, the new configuration avoids excessively large triggering voltages. The trigger element allows adjustment and/or selection of trigger and holding voltages for the SCR device, for example, according to operational characteristics of a device to be protected.

FIG. 1A is a cross sectional view of a conventional silicon controlled rectifier (SCR) device 100. The device 100 is provided as an example of a conventional SCR device. The device 100 is an npnp structure and is employed in semiconductor devices to mitigate damage from electrostatic discharge events by turning on or operating during the electrostatic discharge events and dissipating current. As a result, the semiconductor device(s) are protected from the electrostatic discharge events.

The device 100 comprises a semiconductor body 102 comprised of one or more semiconductor layers, including a semiconductor substrate, such as silicon. An nwell region 104 is formed within the semiconductor body 102 by selectively implanting n-type dopant(s). A pwell region 106 is formed within the semiconductor body 102 and adjacent to the nwell region 104 by selectively implanting p-type dopant(s). One or more isolation structures 108 are formed within the semiconductor body 102 to isolate regions of the device 100 and define active regions.

A first region 110 having an n-type conductivity is formed in the nwell region 104. A second region 112 having a p-type conductivity is formed in the nwell region 104 and is separated from the first region by one of the isolation structures 108. A third region 114 having the n-type conductivity is formed in the pwell region 106 and is separated from the second region 112 by one of the isolation structures 108. A fourth region 116 having the p-type conductivity is also formed in the pwell region 106 and is separated from the third region 114 by another of the isolation structures 108.

The first region 110 and the second region 112 are connected to a pad 118 of a device to be protected. The third region 114 and the fourth region 116 are connected to a second terminal at a reference potential, typically ground. The device 100 operates in a high impedance state, wherein high impedance is present between the pad 118 and the second terminal 120, and a low impedance state, wherein low impedance is present between the pad 118 and the terminal 120. The device 100, can be brought into the low impedance state to mitigate or prevent high voltages from being applied to the protected device.

Initially, with no voltages applied, the device 100 is in the high impedance state. However, when a trigger voltage or greater is applied to the pad 118 with respect to the second terminal 120, the device 100 changes from the high impedance state to the low impedance state. At this point, the nwell region 104 becomes reversed biased and breaks down. The effect of breaking down is injecting positive carriers collected at the second terminal 120. As a result, the device enters the low impedance and current to be conducted from the pad 118 to the second terminal 120. The device 100 remains in the low impedance state as long as a holding voltage or greater is applied to the pad 118 with respect to the second terminal 120.

The FIG. 1A also includes an equivalent schematic overlain on the cross sectional view of the device. Resistance of the nwell region 104 is depicted as RN, resistance of the semiconductor body 102 is depicted as RSUB, a pnp transistor formed from the second region 112, the nwell region 104, and the semiconductor body 102 is depicted as TN, and an npn transistor formed from the nwell region 104, the pwell region 106, and the third region 114 is depicted as TP.

Figure 1B:
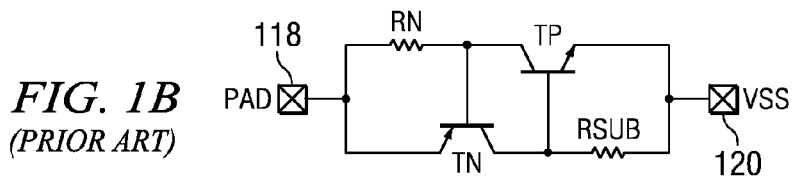
FIG. 1B illustrates an equivalent schematic of the device of FIG. 1A.

FIG. 1B illustrates an equivalent schematic of the device 100 of FIG. 1A. The equivalent schematic is exemplary in nature and does not necessarily capture all of the operating qualities of the device 100.

The schematic of FIG. 1B includes an RN resistor, a TN transistor, a TP transistor, and an RSUB resistor, which are also described above with respect to FIG. 1A. A pad 118 is connected to a first terminal of the RN resistor and an emitter of the TN transistor, which is a PNP type bipolar junction transistor. A base of the TN transistor is connected to a second terminal of the RN resistor and a collector of the TP transistor, which is an NPN type bipolar junction transistor. A collector of the TN transistor is connected to a first terminal of the RSUB resistor and a base of the TP transistor. An emitter of the TP transistor and a second terminal of the RSUB resistor are connected to a second terminal 120.

The schematic is initially at a high impedance state without voltages applied to the pad 118 and the second terminal 120. Both the TN transistor and the TP transistor are off and prevent substantial current from flowing there through. On the application of a trigger voltage or greater the pad 118 with respect to the second terminal 120, the schematic transfers from the high impedance state to a low impedance state. On the application of the trigger voltage or greater, breakdown of the nwell region 104 occurs and current substantially flows through the TN transistor and the RSUB resistor, in parallel. At least a holding voltage is applied to the pad 118 in order to maintain the low impedance state by keeping the TN transistor on. On an applied voltage to the pad 118 dropping below the holding voltage, the TN transistor turns off and the schematic returns to the high impedance state.

Figure 2:
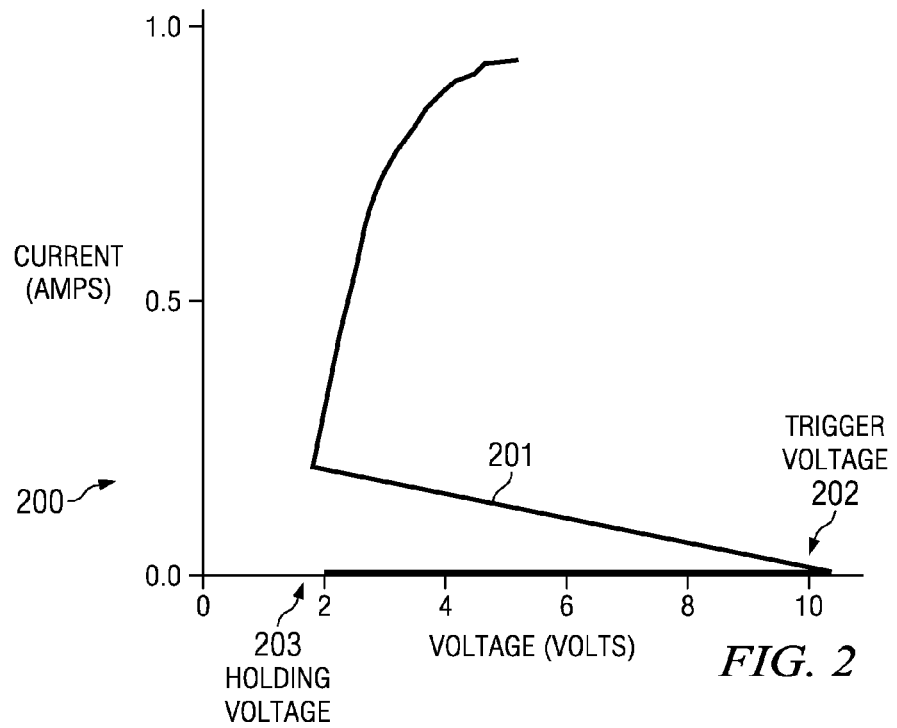
FIG. 2 is a graph illustrating typical current-voltage characteristics for a conventional SCR device.

FIG. 2 is a graph illustrating typical current-voltage characteristics for a conventional SCR device, such as the device 100 of FIG. 1A. The graph is provided for illustrative purposes in order to identify problem(s) associated with conventional SCR devices, such as the device 100 of FIG. 1A.

An x-axis relates to voltages applied to a pad of the conventional SCR device, such as the pad 118 of the device 100 of FIG. 1A. The x-axis is in volts. A y-axis relates to current flowing through the conventional SCR device, such as from the pad 118 to the second terminal 120 of the device 100 of FIG. 1. A line 201 represents an exemplary current-voltage response for the conventional SCR device.

Initially, a voltage below a trigger voltage 202 is applied to the pad which causes the device to remain in a high impedance state. As a result, little or no current flows through the device because of the high impedance state. Once the applied voltage reaches the trigger voltage 202, the device turns on and changes form the high impedance state to a low impedance state. In the exemplary conventional SCR device, the trigger voltage is just over 10 volts. Once the device is in the low impedance state, current increasing begins to flow through the device as shown by the line 201. The current flowing through the device serves to lower the applied voltage and dissipate current and power and, thereby, protect another semiconductor device or circuit. The device remains in the low impedance state so long as at least a holding voltage 203, which is just under 2 volts in this example, is applied to the pad.

Generally, for ESD protection, a suitable ESD device should activate before damaging voltage levels are reached, dissipate the excessive voltage and current, and turn off or deactivate once a safe voltage level is obtained. Conventional SCR devices are often employed for ESD protection because they provide relatively high performance while requiring limited die area, or a high ESD performance per unit area. However, the line 201 illustrates a number of problems the inventors of the present invention have noted regarding conventional SCR devices. One problem with conventional SCR devices is that the required trigger voltage is too high, such as just over 10 volts for the trigger voltage 202. Such high trigger voltages fail to offer sufficient voltage protection to protected circuits and/or devices. As an example, many circuits and/or semiconductor devices can be damaged or destroyed at voltages well below 10 volts, such as, for example, applied voltages greater than 6 volts. For example, thin oxides can be damaged or destroyed by voltages greater than or equal to 6 volts. Another problem with conventional SCR devices is that the required holding voltage is too low, such as under 2 volts for the holding voltage 203. Such low holding voltages prevent the conventional SCR devices from turning off or deactivating as on returning to normal operating conditions and can be prone to latch-up.

Figure 3A:
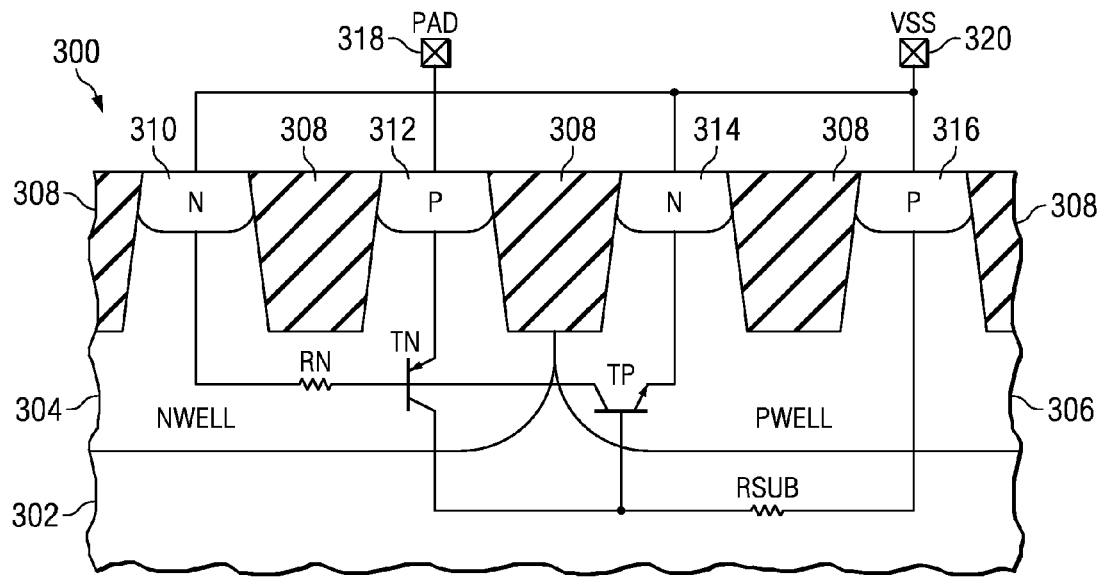
FIG. 3A is a cross sectional view of a silicon controlled rectifier (SCR) device in accordance with an aspect of the present invention.

FIG. 3A is a cross sectional view of a silicon controlled rectifier (SCR) device 300 in accordance with an aspect of the present invention. The device 300 is a low capacitance and high performance per unit area device. Additionally, the device 300 employs a forward injection triggering mechanism instead of electrical breakdown, such as the electrical breakdown mechanism employed by the conventional SCR device 100 of FIG. 1A. The device 300 is a PNPN structure and is employed in semiconductor devices to mitigate damage from electrostatic discharge events by turning on or operating during the electrostatic discharge events and dissipating current. As a result, the semiconductor device(s) are protected from the electrostatic discharge events.

The device 300 comprises a semiconductor body 302 comprised of one or more semiconductor layers, including a semiconductor substrate, such as silicon and/or one or more epitaxial layers. An nwell region 304 is formed within the semiconductor body 302 by selectively implanting n-type dopant(s). A pwell region 306 is formed within the semiconductor body 302 and adjacent to the nwell region 304 by selectively implanting p-type dopant(s). One or more isolation structures 308 are formed within the semiconductor body 302 to isolate regions of the device 300 and define active regions.

A first region 310 having an n-type conductivity is formed in the nwell region 304. A second region 312 having a p-type conductivity is formed in the nwell region 304 and is separated from the first region by one of the isolation structures 308. A third region 314 having the n-type conductivity is formed in the pwell region 306 and is separated from the second region 312 by one of the isolation structures 308. A fourth region 316 having the p-type conductivity is also formed in the pwell region 306 and is separated from the third region 314 by another of the isolation structures 308.

The second region 312 is connected to a pad 318 of a device to be protected. The first region 310, the third region 314, and the fourth region 316 are connected to a second terminal 320 at a reference potential, typically ground. The device 300 operates in a high impedance state, wherein high impedance is present between the pad 318 and the second terminal 320, and a low impedance state, wherein low impedance is present between the pad 318 and the terminal 320. The device 300, can be brought into the low impedance state to mitigate or prevent high voltages from being applied to the protected device.

Without a voltage applied across the pad 318 and the second terminal 320, the device 300 is in the high impedance state, also referred to as an off or deactivated state. However, when a trigger voltage or greater is applied to the pad 318 with respect to the second terminal 320, the device 300 changes from the high impedance state to a low impedance state, also referred to as an on or activated state. At this point, forward injection occurs and results in causing low impedance and current to be conducted from the pad 318 to the second terminal 320. The device 300 remains in the low impedance state as long as a holding voltage or greater is applied to the pad 318 with respect to the second terminal 320.

The trigger voltage and holding voltage obtained by the device 300 are referred to as base or unmodified trigger and holding voltages. Generally, the base trigger and holding voltages are too low to be employed for ESD protection of some devices. In another aspect, described below, a trigger element is added that permits selection and/or adjustment of the trigger and holding voltages.

FIG. 3A also includes an equivalent schematic overlain on the cross sectional view of the device. Resistance of the nwell region 304 is depicted as RN, resistance of the semiconductor body 302 is depicted as RSUB, a pnp transistor formed from the second region 312, the nwell region 304, and the semiconductor body 302 is depicted as TN, and an npn transistor formed from the nwell region 304, the pwell region 306, and the third region 314 is depicted as TP.

It is also noted that the present invention also includes alternate aspects wherein the conductivity is reversed resulting in an NPNP structure.

Figure 3B:
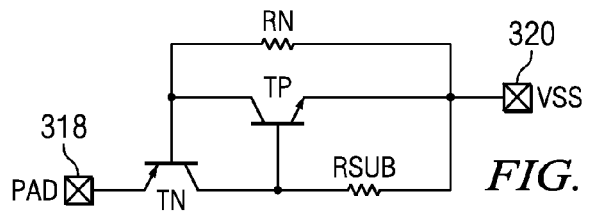
FIG. 3B illustrates an equivalent schematic of the device of FIG. 3A in accordance with an aspect of the present invention.

FIG. 3B illustrates an equivalent schematic of the device 300 of FIG. 3A in accordance with an aspect of the present invention. The equivalent schematic is exemplary in nature and does not necessarily capture all of the operating qualities of the device 300.

The schematic of FIG. 3B includes an RN resistor, a TN transistor, a TP transistor, and an RSUB resistor, which are also described above with respect to FIG. 3A. A pad 318 is connected to and an emitter of the TN transistor, which is a PNP type bipolar junction transistor. A base of the TN transistor is connected to a first terminal of the RN resistor and a collector of the TP transistor, which is an NPN type bipolar junction transistor. A collector of the TN transistor is connected to a first terminal of the RSUB resistor and a base of the TP transistor. An emitter of the TP transistor, a second terminal of the RSUB resistor, and a second terminal of the RN resistor are connected to a second terminal 320.

The schematic is initially at a high impedance state without voltages applied to the pad 318 and the second terminal 320. Both the TN transistor and the TP transistor are off and prevent substantial current from flowing there through. On the application of a trigger voltage or greater the pad 318 with respect to the second terminal 320, the schematic transfers from the high impedance state to a low impedance state. On the application of the trigger voltage or greater, forward injection occurs and current substantially flows through the TN transistor and the RSUB resistor. At least a holding voltage is applied to the pad 318 in order to maintain the low impedance state by keeping the TN transistor on. On an applied voltage to the pad 318 dropping below the holding voltage, the TN transistor turns off and the schematic returns to the high impedance state.

Figure 4:
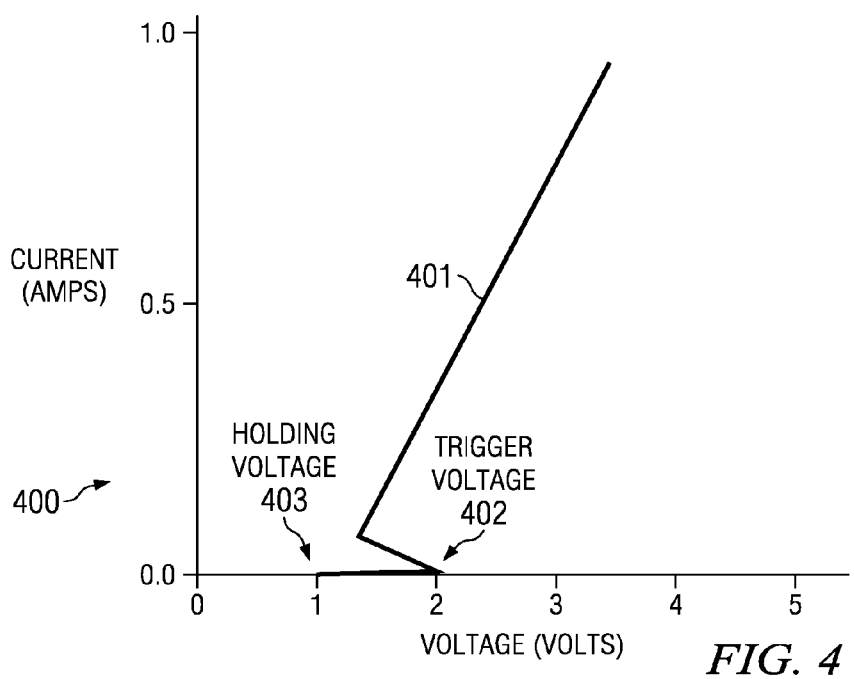
FIG. 4 is a graph illustrating exemplary current-voltage characteristics for an SCR device in accordance with the present invention.

FIG. 4 is a graph illustrating exemplary current-voltage characteristics for an SCR device in accordance with the present invention, such as the device 300 of FIG. 3A. The graph is provided for illustrative purposes in order to facilitate understanding of the present invention.

An x-axis relates to voltages applied to a pad of the SCR device, such as the pad 318 of the device 300 of FIG. 3A. A y-axis relates to current flowing through the SCR device, such as from the pad 318 to the second terminal 320 of the device 300 of FIG. 3. A line 401 represents an exemplary current-voltage response for the SCR device.

Starting out, a voltage below a trigger voltage 402 is applied to the pad which causes the device to remain in a high impedance state. As a result, little or no current flows through the device because of the high impedance state. The applied voltage across the pad and the second terminal is increased until it reaches the trigger voltage 402. At this point, the device activates and changes form the high impedance state to a low impedance state. It is noted that in this example the trigger voltage 402 is relatively low (about 2 volts). This trigger voltage 402 is much lower than the trigger voltage 202 of the conventional SCR device. However, the trigger voltage 402 may be too low for some semiconductor devices and/or circuits to be protected. As a result, the SCR device can interfere with normal operation of such devices by interacting or activating when not needed.

Once the device is in the low impedance state or activated, current flows through the device as shown by the line 401. The current flowing through the device serves to lower the applied voltage and dissipate current and power and, thereby, protect another semiconductor device or circuit. The device remains in the low impedance state so long as at least a holding voltage 403, which is over 1 volt in this example. In this example, the holding voltage 403 is lower than the holding voltage 203 of the conventional SCR device of FIG. 2, however the present invention is not limited to holding voltages lower than conventional SCR devices and can include holding voltages equal to and/or greater than conventional SCR devices. The holding voltage 403 is relatively low in this example and can lead to problems, such as latch-up conditions.

Figure 5A:
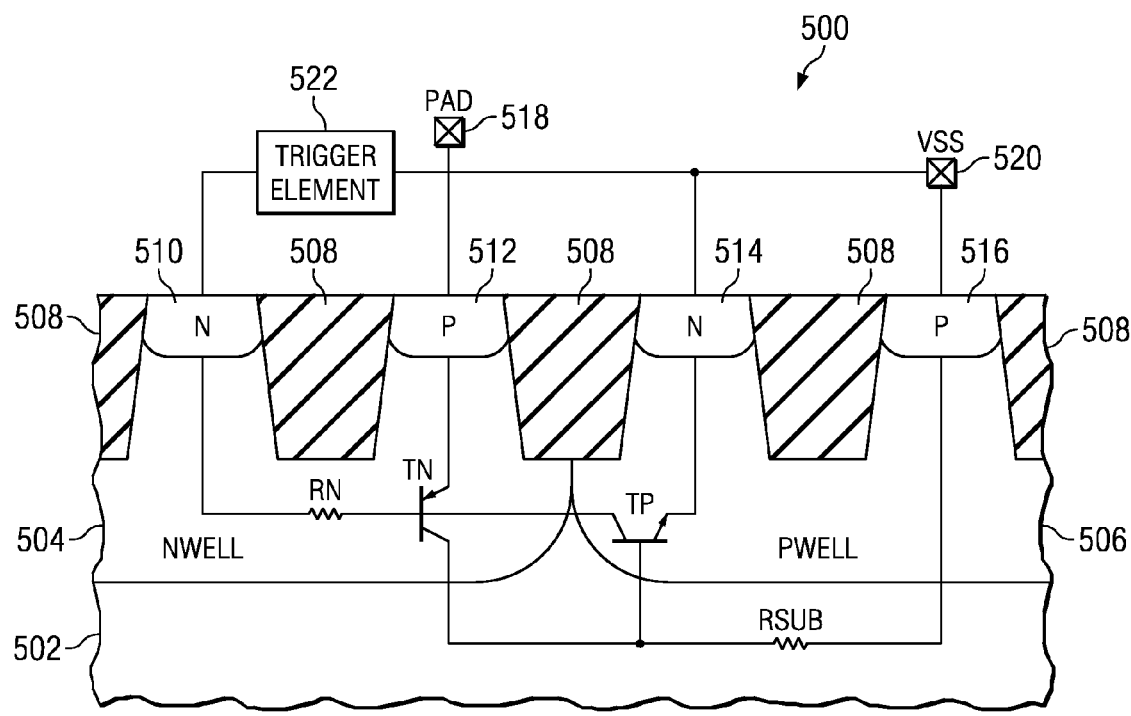
FIG. 5A is a cross sectional view of a silicon controlled rectifier (SCR) device in accordance with an aspect of the present invention.

FIG. 5A is a cross sectional view of a silicon controlled rectifier (SCR) device 500 in accordance with an aspect of the present invention. The device 500 is a low capacitance and high performance per unit area device and includes a trigger element that permits adjustment and/or selection of altered trigger and holding voltages, other than base trigger and holding voltages. The device 500 employs a forward injection triggering mechanism instead similar to the device 300 of FIG. 3. The device 500 is a PNPN structure and is employed in semiconductor devices to mitigate damage from electrostatic discharge events by turning on or operating during the electrostatic discharge events and dissipating current. As a result, the subject semiconductor device(s) are protected from the electrostatic discharge events.

The device 500 is similar in structure and configuration to the device 300 of FIG. 3, except that a trigger element 522 is present in between a first region 510 and a second terminal 520. Therefore, some description of the common elements are omitted.

The device 500 comprises a semiconductor body 502 wherein an nwell region 504 is formed within the semiconductor body 502 by selectively implanting n-type dopant(s). A pwell region 506 is formed within the semiconductor body 502 and adjacent to the nwell region 504 by selectively implanting p-type dopant(s). One or more isolation structures 508 are formed within the semiconductor body 502 to isolate regions of the device 500 and define active regions.

A first region 510 having an n-type conductivity is formed in the nwell region 504. A second region 512 having a p-type conductivity is formed in the nwell region 504 and is separated from the first region by one of the isolation structures 508. A third region 514 having the n-type conductivity is formed in the pwell region 506 and is separated from the second region 512 by one of the isolation structures 508. A fourth region 516 having the p-type conductivity is also formed in the pwell region 506 and is separated from the third region 514 by another of the isolation structures 508. The trigger element 522 is formed within or over the semiconductor body 502. In alternate aspects of the invention, the trigger element can be formed separate from the semiconductor body 502.

The second region 512 is connected to a pad 518 of a device to be protected. The trigger element 522, the third region 514, and the fourth region 516 are connected to a second terminal 520 at a reference potential, typically ground. The first region 510 is connected to the trigger element 522. The device 500 operates in a high impedance state, wherein high impedance is present between the pad 518 and the second terminal 520, and a low impedance state, wherein low impedance is present between the pad 518 and the terminal 520. The device 500, can be brought into the low impedance state to mitigate or prevent high voltages from being applied to the protected device.

The trigger element 522 yields and permits an altered trigger voltage and holding voltage for the device 500 instead of the base trigger and holding voltages of the device 300 of FIG. 3. The altered trigger voltage is greater than or equal to a base trigger voltage and the altered holding voltage is greater than or equal to a base holding voltage.

The trigger element 522 creates a voltage difference or voltage offset between the first region 510 and the second terminal 520. The created voltage offset adds to the base trigger voltage and the base holding voltage to obtain the altered trigger voltage and the altered holding voltage. The trigger element 522 can comprise one or more individual components in order to obtain the voltage offset. In one example, the trigger element 522 is simply a short circuit that yields an altered trigger voltage equal to the base trigger voltage and an altered holding voltage equal to the base holding voltage. In another example, the trigger element 522 comprises one or more diodes that yield a higher altered trigger voltage and altered holding voltage. In yet another example, NMOS or PMOS transistor devices are employed with grounded gates or gate coupling in order to obtain the altered trigger and holding voltages. Some more specific examples of suitable configurations that can be employed for the trigger element 522 are described below.

Without a voltage applied across the pad 518 and the second terminal 520, the device 500 is in the high impedance state, also referred to as an off or deactivated state. However, when an altered trigger voltage or greater is applied to the pad 518 with respect to the second terminal 520, the device 500 changes from the high impedance state to a low impedance state, also referred to as an on or activated state. At this point, forward injection occurs and results in causing low impedance and current to be conducted from the pad 518 to the second terminal 520. The device 500 remains in the low impedance state as long as the altered holding voltage or greater is applied to the pad 518 with respect to the second terminal 520.

The trigger voltage and holding voltage obtained by the device 500 are selectable and/or configurable due to the trigger element 522. As a result, the altered trigger voltage can be selected so as to provide ESD protection for a particular device. Typically, the altered trigger voltage is selected to be greater than an operating voltage but less than a destructive or damaging voltage for the particular device. Similarly, the altered holding voltage can be selected to as to permit ESD protection without encountering latch-up conditions. Typically, the altered holding voltage is selected to be below a range of operating voltages of the particular protected device.

Additionally, FIG. 5A includes an equivalent schematic overlain on the cross sectional view of the device. The equivalent schematic is provided for illustrative purposes. Resistance of the nwell region 504 is depicted as RN, resistance of the semiconductor body 502 is depicted as RSUB, a pnp transistor formed from the second region 512, the nwell region 504, and the semiconductor body 502 is depicted as TN, and an npn transistor formed from the nwell region 504, the pwell region 506, and the third region 514 is depicted as TP.

Figure 5B:
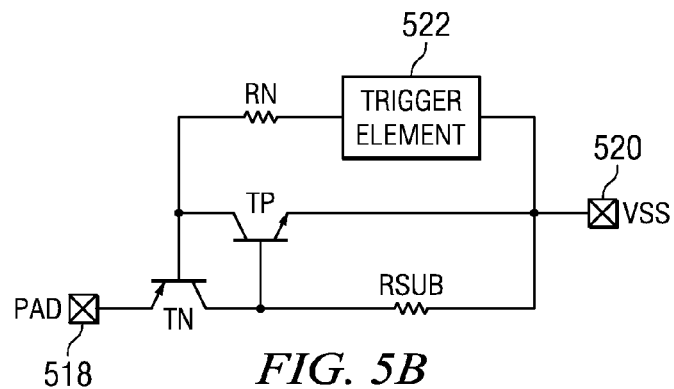
FIG. 5B illustrates an equivalent schematic of the device of FIG. 5A in accordance with an aspect of the present invention.

FIG. 5B illustrates an equivalent schematic of the device 500 of FIG. 5A in accordance with an aspect of the present invention. The equivalent schematic is exemplary in nature and does not necessarily capture all of the operating qualities of the device 500.

The schematic of FIG. 5B includes an RN resistor, a trigger element 522, a TN transistor, a TP transistor, and an RSUB resistor, which are also described above with respect to FIG. 5A. A pad 518 is connected to and an emitter of the TN transistor, which is a PNP type bipolar junction transistor. A base of the TN transistor is connected to a first terminal of the RN resistor and a collector of the TP transistor, which is an NPN type bipolar junction transistor. A collector of the TN transistor is connected to a first terminal of the RSUB resistor and a base of the TP transistor. An emitter of the TP transistor and a second terminal of the RSUB resistor are connected to a second terminal 520. A second terminal of the RN resistor is connected to the trigger element 522, which is itself connected to the second terminal 520.

The schematic is initially at a high impedance state without voltages applied to the pad 518 and the second terminal 520. Both the TN transistor and the TP transistor are off and prevent substantial current from flowing there through. On the application of a trigger voltage or greater the pad 518 with respect to the second terminal 520, the schematic transfers from the high impedance state to a low impedance state. The altered trigger voltage is at least equal to the base trigger voltage due to the trigger element 522. With the applied voltage now equal or greater to the altered trigger voltage, forward injection occurs and current substantially flows through the TN transistor and the RSUB resistor. At least an altered holding voltage is applied to the pad 518 in order to maintain the low impedance state by keeping the TN transistor on. On an applied voltage to the pad 518 dropping below the holding voltage, the TN transistor turns off and the schematic returns to the high impedance state.

Figure 6:
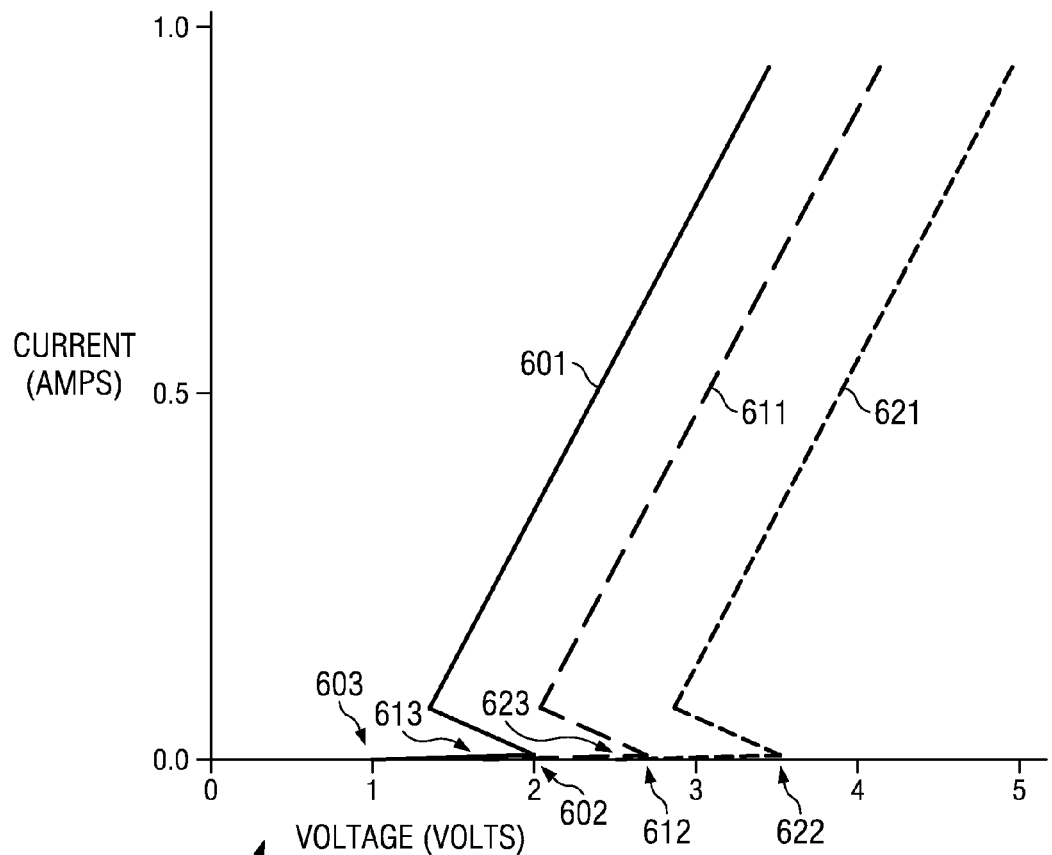
FIG. 6 is a graph illustrating exemplary current-voltage characteristics for SCR devices with a trigger element in accordance with the present invention.

FIG. 6 is a graph illustrating exemplary current-voltage characteristics for SCR devices with a trigger element in accordance with the present invention, such as the device 500 of FIG. 5A. The trigger element of the device permits altered trigger and holding voltages to be employed with the SCR device. The graph is provided for illustrative purposes in order to facilitate understanding of the present invention.

An x-axis relates to voltages applied to a pad of the SCR devices, such as the pad 518 of the device 500 of FIG. 5A. A y-axis relates to current flowing through the SCR devices, such as from the pad 518 to the second terminal 520 of the device 500 of FIG. 5.

Three different plots are depicted in FIG. 6 which depict various implementations of trigger elements. A line 601 represents an exemplary current-voltage response for a first SCR device with a short circuit for a trigger element. This first SCR device operates at a base trigger voltage 602 and a base holding voltage 603. Another line 611 represents an exemplary current-voltage response for a second SCR device with a single diode as a trigger element. This second SCR device operates at an altered trigger voltage 612 and an altered holding voltage 613 increased from the base trigger and holding voltages by a voltage drop across the single diode. Yet another line 621 represents an exemplary current-voltage response for a third SCR device with two diodes connected in series as a trigger element. The third SCR device operates with an altered trigger voltage 622 and an altered holding voltage 623 increased from the base trigger and holding voltages by a voltage drop across the two diodes connected in series, which is twice the amount of the second SCR device.

The graph of FIG. 6 illustrates how different altered trigger and holding voltages can be obtained by altering the trigger elements. Thus, trigger elements can be configured so as to obtain altered trigger and holding voltages appropriate or suitable for semiconductor device(s) to be protected.

FIGS. 7A to 7G are provided below to illustrate examples of suitable trigger elements that can be employed in accordance with the present invention. The examples are illustrative in nature and are not intended to limit or prevent other suitable trigger elements from being employed in accordance with the present invention. Additionally, variations of the below examples are permitted in accordance with the present invention.

Figure 7A:
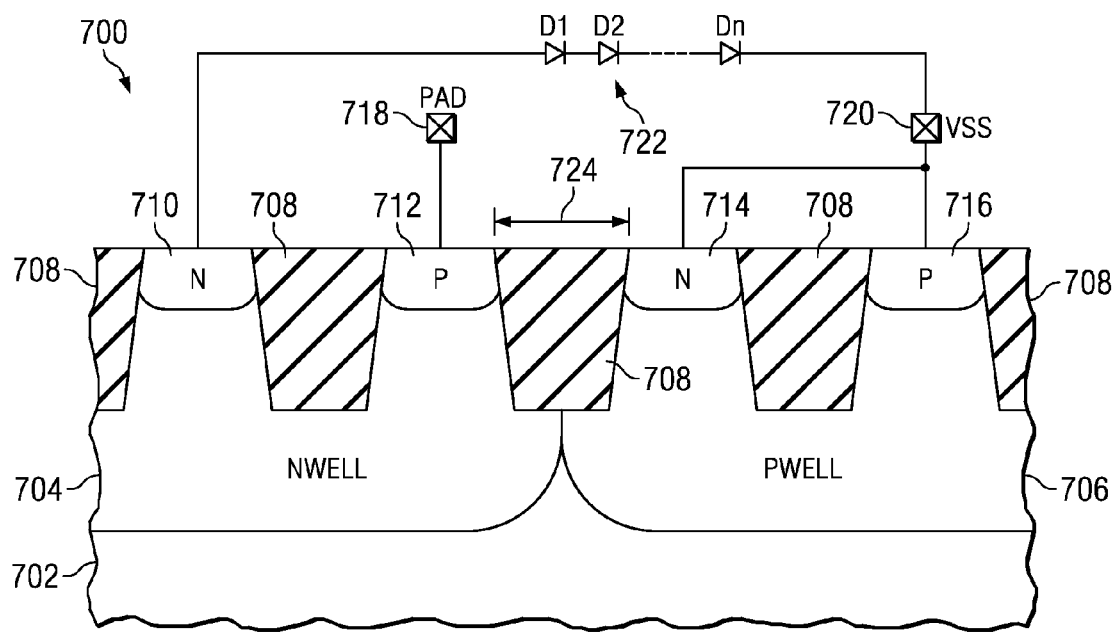
FIG. 7A is a cross sectional view of an SCR device with a series of diodes as a trigger element in accordance with an aspect of the present invention.

FIG. 7A is a cross sectional view of an SCR device 700 with a series of diodes as a trigger element 722 in accordance with an aspect of the present invention. The device 700 is a low capacitance and high performance per unit area device and includes a trigger element that permits adjustment and/or selection of altered trigger and holding voltages, other than base trigger and holding voltages.

The device 700 is similar in structure and configuration to the device 500 of FIG. 3, except that a trigger element 722 is present in between a first region 710 and a second terminal 720. Therefore, some description of the common elements are omitted.

The device 700 comprises a semiconductor body 702 wherein an nwell region 704 is formed within the semiconductor body 702 by selectively implanting n-type dopant(s). A pwell region 706 is formed within the semiconductor body 702 and adjacent to the nwell region 704 by selectively implanting p-type dopant(s). One or more isolation structures 708 are formed within the semiconductor body 702 to isolate regions of the device 700 and define active regions.

A first region 710 having an n-type conductivity is formed in the nwell region 704. A second region 712 having a p-type conductivity is formed in the nwell region 704 and is separated from the first region by one of the isolation structures 708. A third region 714 having the n-type conductivity is formed in the pwell region 706 and is separated from the second region 712 by one of the isolation structures 708. A fourth region 716 having the p-type conductivity is also formed in the pwell region 706 and is separated from the third region 714 by another of the isolation structures 708. The trigger element 722 is formed within or over the semiconductor body 702. In alternate aspects of the invention, the trigger element can be formed separate from the semiconductor body 702.

The second region 712 is connected to a pad 718 of a device to be protected. The trigger element 722, the third region 714, and the fourth region 716 are connected to a second terminal 720 at a reference potential, typically ground. The first region 710 is connected to the trigger element 722. A minimum spacing 724 is required between the second region 712 and the third region 714 to obtain proper operation of the device.

The trigger element 722 is comprised of a series of diodes connected between the first region 710 and the second terminal 720. The number of diodes present determines the triggering voltage. The diodes can be formed, for example, within the semiconductor body 702 as p-type conductivity regions formed within n-well regions.

Figure 7B:
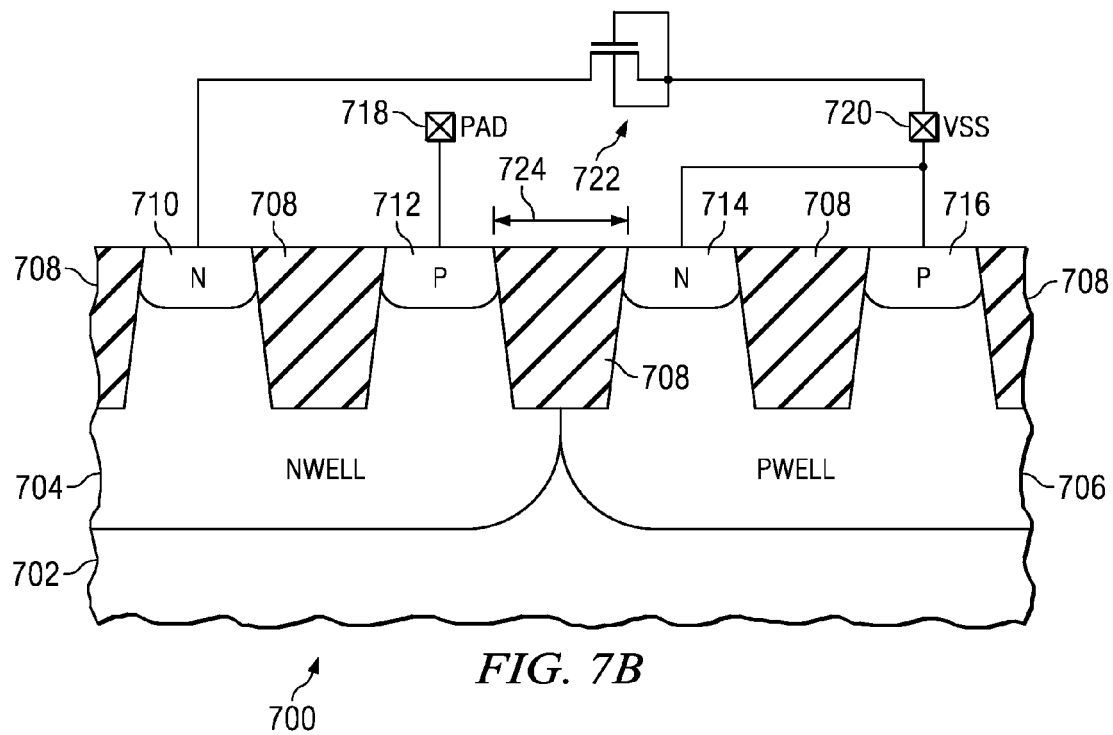
FIG. 7B is a cross sectional view of an SCR device with a grounded gate NMOS transistor as a trigger element in accordance with an aspect of the present invention.

FIG. 7B is a cross sectional view of an SCR device 700 with a grounded gate NMOS transistor as a trigger element 722 in accordance with an aspect of the present invention. This view is exemplary in nature and is provided to facilitate understanding of the present invention.

Here, the grounded gate NMOS transistor is employed as the trigger element instead of the series of diodes. The gate of the NMOS transistor is connected to the second terminal (or ground). The breakdown of the grounded gate NMOS transistor alters the trigger and holding voltage of the device 700.

Figure 7C:
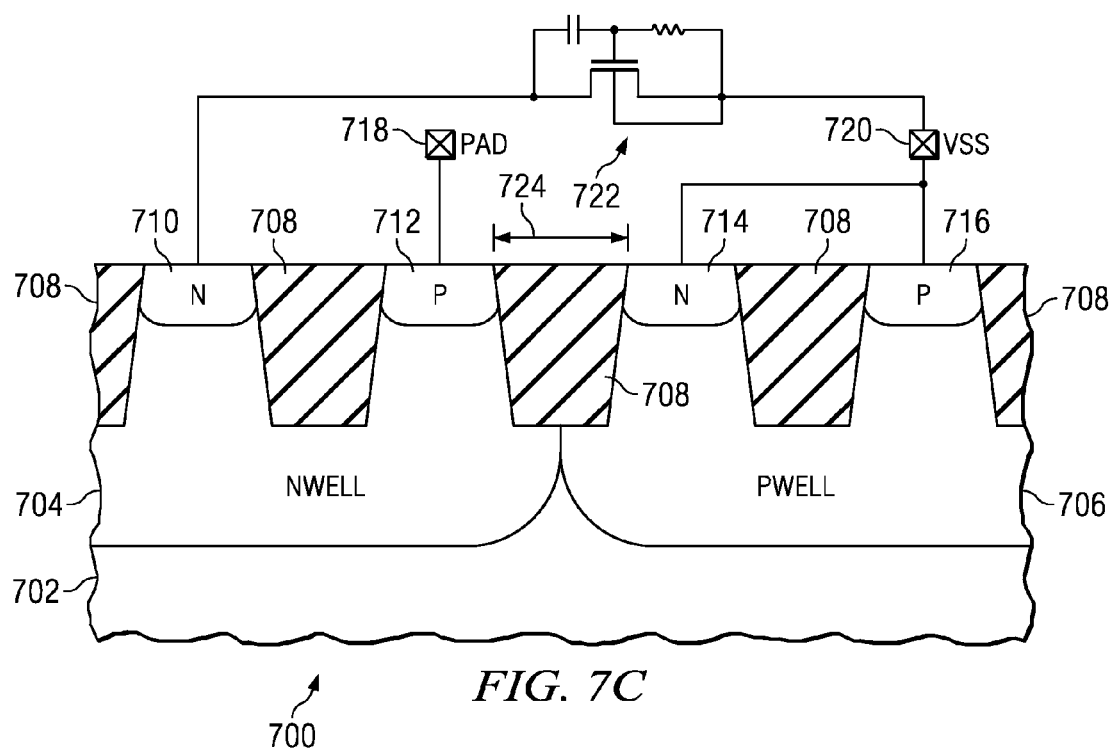
FIG. 7C is a cross sectional view of an SCR device with a gate coupled NMOS transistor as a trigger element in accordance with an aspect of the present invention.

FIG. 7C is a cross sectional view of an SCR device 700 with a gate coupled NMOS transistor as a trigger element 722 in accordance with an aspect of the present invention. This view is exemplary in nature and is provided to facilitate understanding of the present invention.

Here, the gate coupled NMOS transistor is employed as the trigger element 722. A first terminal of a capacitor and a source of the NMOS transistor are connected to the first region 710. A gate of the transistor is connected to a second terminal of the capacitor, a first terminal of a resistor, and to the second terminal 720. A second terminal of the resistor and a drain of the transistor are also connected to the second terminal 720. A breakdown voltage of the NMOS transistor determines the altered trigger voltage and the altered holding voltage.

Figure 7D:
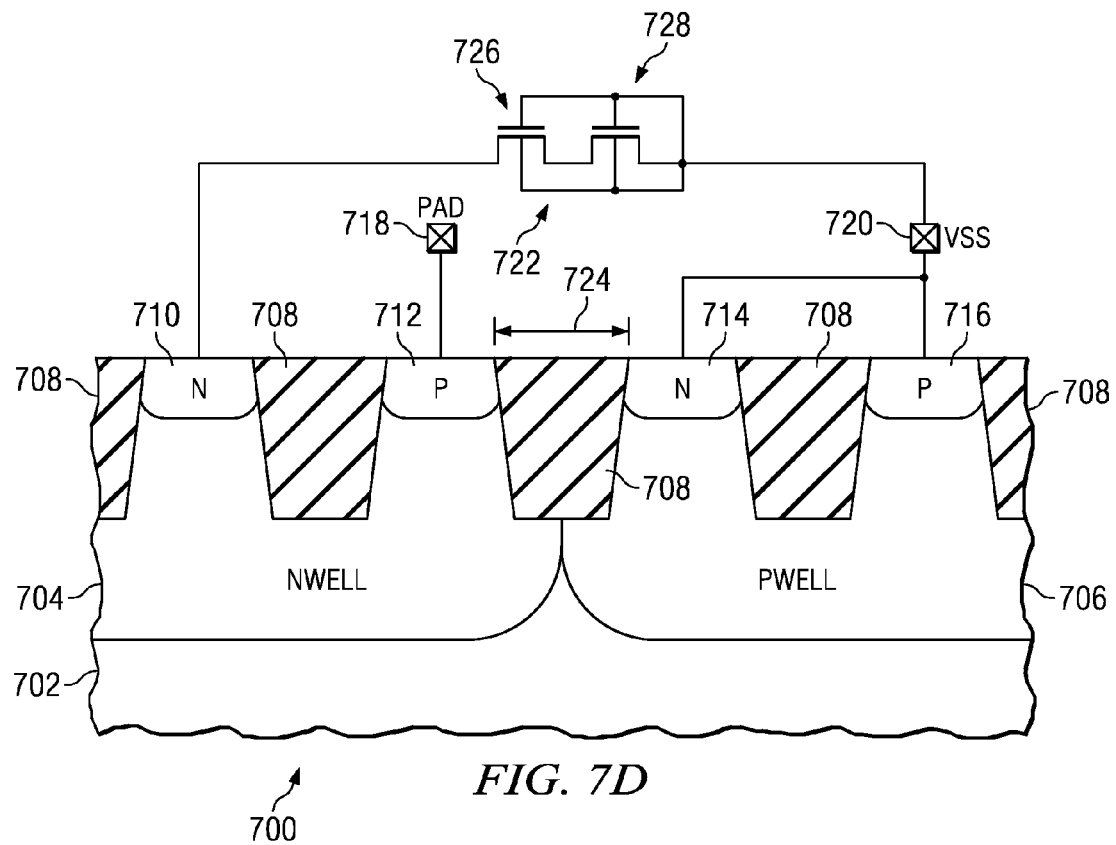
FIG. 7D is a cross sectional view of an SCR device with a cascoded NMOS circuit as a trigger element in accordance with an aspect of the present invention.

FIG. 7D is a cross sectional view of an SCR device 700 with a cascoded NMOS circuit as a trigger element 722 in accordance with an aspect of the present invention. This view is exemplary in nature and is provided to facilitate understanding of the present invention.

The cascoded circuit comprises a first NMOS transistor 726 and a second NMOS transistor 728. A source of the first NMOS transistor 726 is connected to the first region 710. A drain of the first NMOS transistor 726 is connected to a source of the second NMOS transistor 728. A gate of the first NMOS transistor 726, a gate of the second NMOS transistor 728, and a drain of the second NMOS transistor are connected to the second terminal 720. A breakdown value for the cascoded circuit determines the altered trigger and holding voltages for the device 700.

Figure 7E:
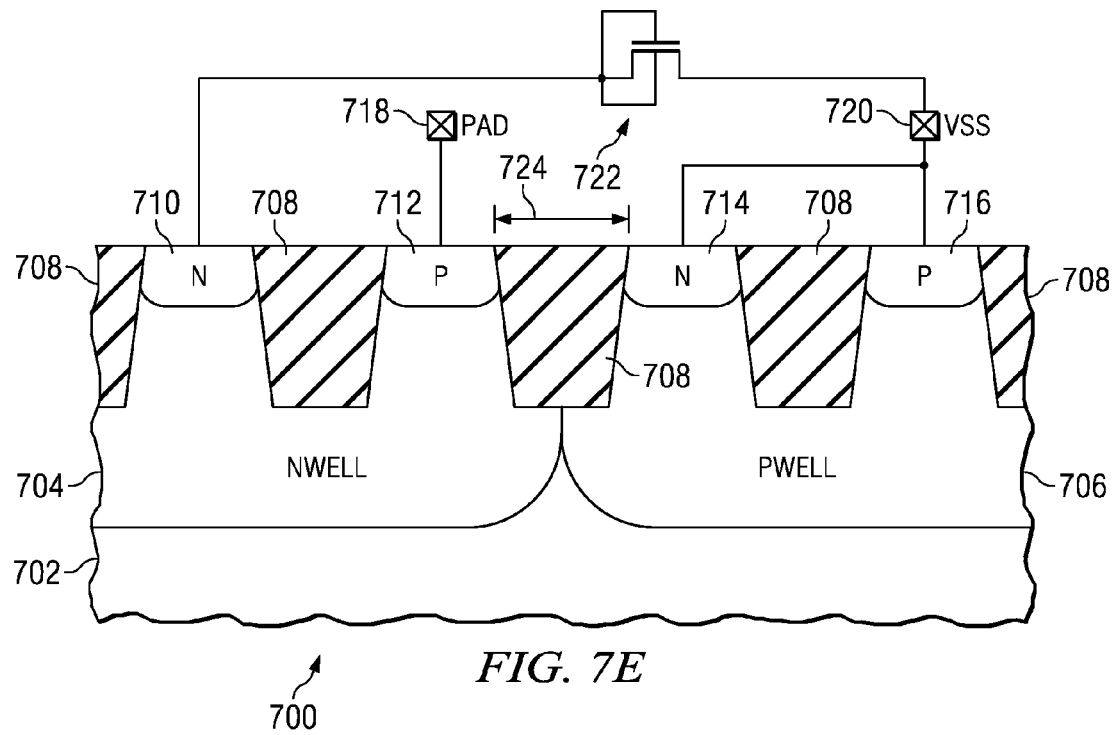
FIG. 7E is a cross sectional view of an SCR device with a grounded drain PMOS transistor as a trigger element in accordance with an aspect of the present invention.

FIG. 7E is a cross sectional view of an SCR device 700 with a grounded drain PMOS transistor as a trigger element 722 in accordance with an aspect of the present invention. This view is exemplary in nature and is provided to facilitate understanding of the present invention.

The trigger element 722 comprises a PMOS transistor. A drain of the transistor is connected to the second terminal 720 and a source and gate of the transistor are connected to the first region 710. A breakdown value of the grounded drain PMOS transistor determines the trigger and holding voltages for the device 700.

Figure 7F:
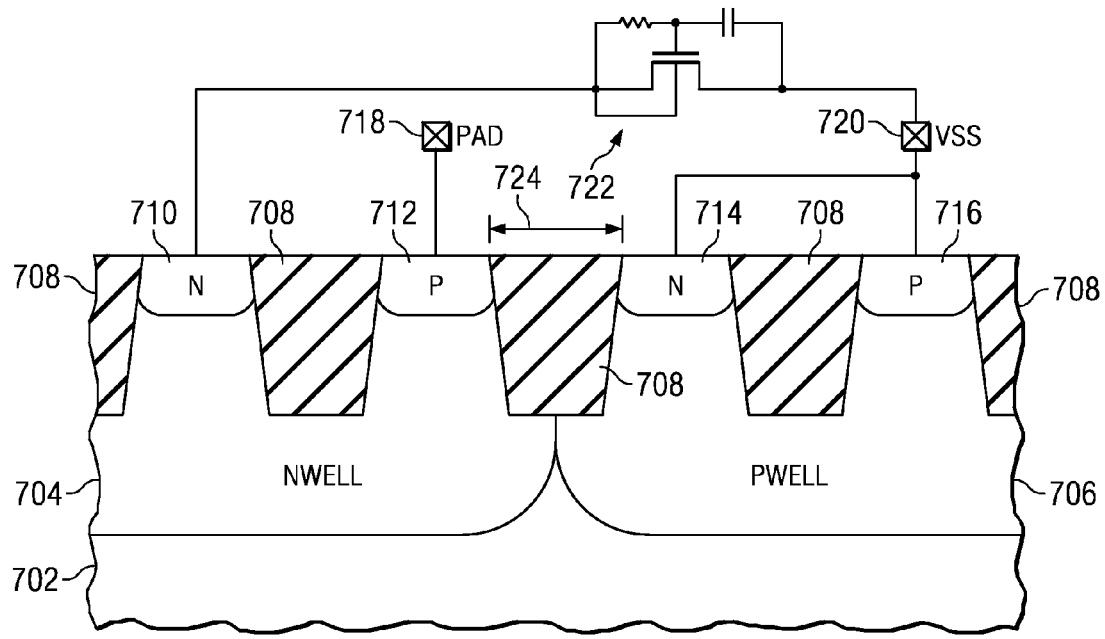
FIG. 7F is a cross sectional view of an SCR device with a gate coupled PMOS transistor as a trigger element in accordance with an aspect of the present invention.

FIG. 7F is a cross sectional view of an SCR device 700 with a gate coupled PMOS transistor as a trigger element 722 in accordance with an aspect of the present invention. This view is exemplary in nature and is provided to facilitate understanding of the present invention.

The trigger element 722 comprises a PMOS transistor. A drain of the transistor is connected to the second terminal 720. A source of the transistor is connected to the first region 710 and a first terminal of a resistor. A gate of the transistor is connected to a second terminal of the resistor and a first terminal of a capacitor. A second terminal of the capacitor is also connected to the second terminal 720. A breakdown value of the gate coupled PMOS transistor determines the trigger and holding voltages for the device 700.

Figure 7G:
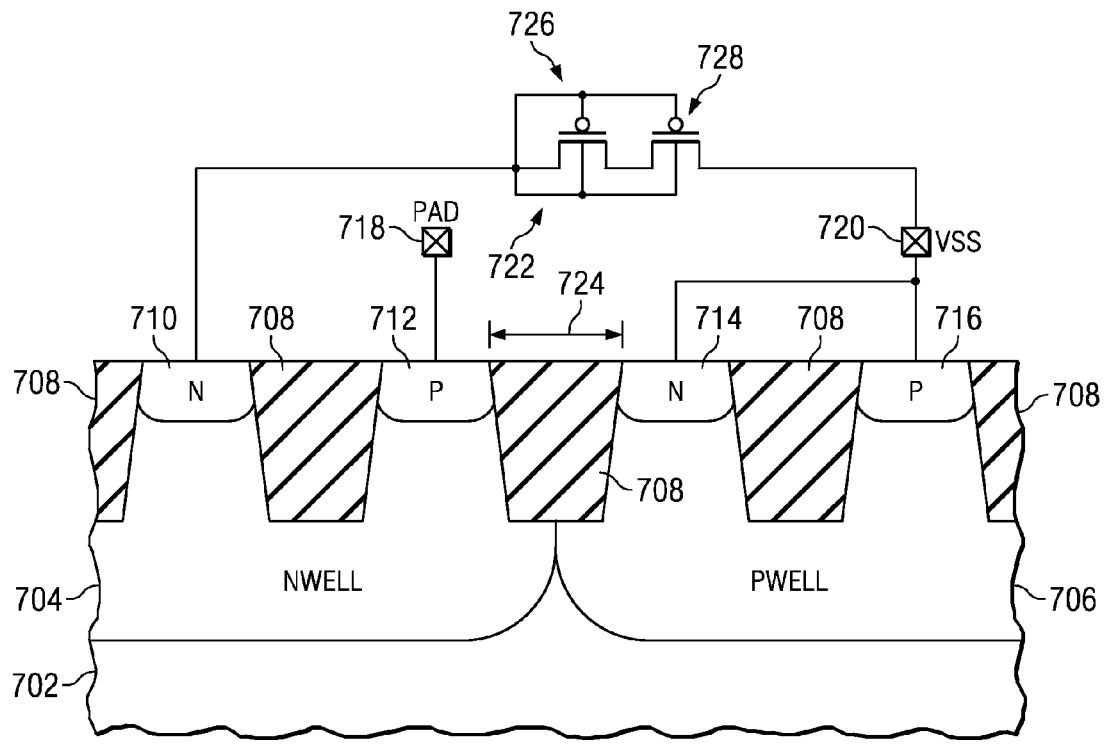
FIG. 7G is a cross sectional view of an SCR device with a cascoded PMOS circuit as a trigger element in accordance with an aspect of the present invention.

FIG. 7G is a cross sectional view of an SCR device 700 with a cascoded PMOS circuit as a trigger element 722 in accordance with an aspect of the present invention. This view is exemplary in nature and is provided to facilitate understanding of the present invention.

The cascoded circuit comprises a first PMOS transistor 726 and a second PMOS transistor 728. The first PMOS transistor 726 and the second PMOS transistor 728 can be formed in separate n-well regions or in a common n-well region. If formed in separate n-well regions, it results in higher trigger voltages than if formed in a common n-well region.

A source of the first NMOS transistor 726 is connected to the first region 710. A drain of the first NMOS transistor 726 is connected to a source of the second NMOS transistor 728.

A gate of the first NMOS transistor 726, a gate of the second NMOS transistor 728, and a drain of the second NMOS transistor are connected to the first region 710. A breakdown value for the cascoded PMOS circuit determines the altered trigger and holding voltages for the device 700.

FIG. 8 is a flow diagram of a method 800 of fabricating and utilizing an SCR device with a trigger element in accordance with an aspect of the present invention. The method 800 fabricates the SCR device with a configuration that yields a relatively low capacitance and high performance per area. The method 800 includes formation of a trigger element that allows adjustment and/or selection of trigger and holding voltages.

While, for purposes of simplicity of explanation, the method 800 is depicted and as executing serially. It is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The method 800 begins at block 802, wherein isolation regions are formed within a semiconductor body thereby defining active regions in between. The isolation regions can be formed as shallow trench isolation regions (STI) or other suitable isolation structures. The semiconductor body is comprised of one or more semiconductor layers, such as silicon substrates, epitaxial layers, doped layers, un-doped layers, and the like.

An nwell region is formed within an active region of the semiconductor body at block 804. The nwell region is formed by selectively implanting n-type dopant(s). A pwell region is also formed within an active region of the semiconductor body at block 806. The pwell region is formed by selectively implanting p-type dopant(s). It is appreciated that one of the nwell and pwell regions can be alternately formed by employing a suitably doped substrate material in accordance with alternate methods of the invention, such as employing p-doped epitaxial layers for the pwell region.

A first region having n-type conductivity is formed in the nwell region at block 808. The first region is formed by selectively implanting n-type dopant(s) with a selected dose and concentration. A second region having p-type conductivity is formed in the nwell region at block 810 and is separated from the first region by one of the isolation structures. The second region is formed by selectively implanting p-type dopant(s) with a selected dose and concentration.

A third region having n-type conductivity is formed in the pwell region at block 812 and is separated from the second region by one of the isolation structures. The third region is formed by selectively implanting n-type dopant(s) with a selected dose and concentration. A fourth region having the p-type conductivity is also formed in the pwell region at block 814 and is separated from the third region by another of the isolation structures.

A trigger element is formed in contact with the first region at block 816. The trigger element can, in one example, be formed within, on, or over the semiconductor body. In another example, the trigger element can be formed in a separate device.

The trigger element is formed as one or more individual devices, such as diodes, NMOS, PMOS transistors, and the like, configured together to yield an altered trigger voltage and an altered holding voltage. The trigger element is formed such that the altered trigger voltage and the altered holding voltage are suitable for the protected device.

A pad, which is typically connected to a device or circuit to be protected, is formed at block 818 and connected to the second region. The pad is comprised of a conductive material, such as copper or tungsten. This connection to the second region can be, for example, a conductive plug or contact, a conductive layer, and/or combinations thereof.

A second terminal is formed in contact with the trigger element, the third region, and the fourth region at block 820. Typically, the second terminal is connected to ground or another reference potential that is typically lower than that at which the pad lies. This connection to the trigger element, the third region, and the fourth region can be, for example, a conductive plug or contact, a conductive layer, and/or combinations thereof. The second terminal is also comprised of a conductive material.

FIG. 9 is a method 900 of forming a trigger element employable with an SCR ESD device in accordance with an aspect of the present invention. The method 900 forms the trigger element so as to provide an altered trigger voltage and an altered holding voltage selected according to operational characteristics of a protected device.

While, for purposes of simplicity of explanation, the method 900 is depicted and as executing serially. It is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

The method begins at block 902, wherein an SCR ESD device triggered by forward injection and having a base trigger voltage and a base holding voltage is provided. The SCR device is similar to that formed by the method 800 of FIG. 8, the device 300 of FIG. 3, the device 500 of FIG. 5, and suitable variations thereof.

Operational characteristics for a protected device are provided at block 904. The operational characteristics include a maximum or breakdown voltage, range of operating voltages, and the like.

An SCR offset voltage for the device is determined at block 906 by subtracting the base holding voltage from the base trigger voltage. In an alternate aspect, the offset voltage may be provided in block 902 thereby avoiding its determination at block 906.

An altered trigger voltage and an altered holding voltage are selected at block 908 according to at least the operational characteristics and the SCR offset voltage. Generally, the altered trigger voltage is selected so as to be less than or equal the maximum or breakdown voltage of the protected device. This permits the SCR ESD device to trigger before a damaging voltage level is applied to the protected device. The altered holding voltage is typically selected so as to be less than or below the range of operating voltages for the protected device. As a result, latch-up conditions and the like can be mitigated. It is noted that in this aspect of the invention, the difference between the altered trigger voltage and the altered holding voltage is about equal to the offset value.

A composition of the trigger element is selected at block 910 according to the altered trigger voltage and the altered holding voltage. Generally, the trigger element is composed so as to yield an altering voltage offset that adds to the base trigger voltage and the base holding voltage to yield the altered trigger voltage and the altered holding voltage. The altering voltage offset is a function of conductance characteristics of the trigger element.

As an example, a number of diodes having about a 0.7 volt drop individually, a base trigger voltage of about 2 volts, and a base holding voltage of about 1 volts. Also, an altered trigger voltage of about 4.1 volts and an altered holding voltage of about 3.1 volts are selected. Three of the diodes connected in series yield the 2.1 altering voltage offset and yield the altered trigger voltage and the altered base voltage of the present example.

The trigger element is then formed at block 912 according to the selected composition. The trigger element is formed so as to be in contact with the first region and the second terminal of the SCR ESD device provided at block 902. As an example, diodes can be formed by forming one or more n-type well regions within a semiconductor body and forming p-type regions therein. Conductive layers and/or contacts can then be formed to connect the diodes in series and connect the diodes to the SCR ESD device. It is noted that the trigger elements has a relatively minor or non-existent contribution to the capacitance value of the SCR device. This is due to the fact that current dissipating or flowing through the SCR device does not substantially flow through the trigger element.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A silicon rectifier semiconductor device for providing electrostatic discharge protection to a circuit element of an integrated circuit, comprising:
    a first well region of a first conductivity type formed within a semiconductor body;
    a first region of the first conductivity type formed within the first well region;
    a second region of a second conductivity type formed within the first well region and connected to a terminal of the circuit element to be protected;
    a second well region of the second conductivity type formed within the semiconductor body adjacent to the first well region;
    a third region of the first conductivity type formed within the second well region and connected to a reference potential terminal;
    a fourth region of the second conductivity type formed within the second well region and connected to the reference potential terminal; and
    a trigger element connected to the first region and the second terminal for setting a base trigger voltage and a base holding voltage;
    the first and second well regions and the first, second, third and fourth regions being relatively dimensioned and configured so that application of a voltage difference between the first and second terminals of at least the base trigger voltage level will switch the silicon rectifier semiconductor device from a deactivated state to an activated state to flow current from the first terminal to the second terminal, and the activated state will be maintained until the voltage difference falls below the base holding voltage.

2. The device of claim 1, wherein the first conductivity type is n-type and the second conductivity type is p-type.

3. The device of claim 1, wherein the first terminal is an anode and the second terminal is a cathode.

4. The device of claim 1, wherein the first terminal is a pin connection pad of the circuit element and the second terminal is ground.

5. The device of claim 1, wherein the holding voltage is less than an operating voltage of the protected circuit element; and the trigger voltage is greater than the operating voltage of the protected circuit element and less than a breakdown voltage of the protected circuit element.

6. The device of claim 5, wherein the protected circuit element is a logic circuit.

7. The device of claim 5, wherein the protected circuit element is a memory device.

8. The device of claim 1, wherein the trigger element comprises a fifth region of the first conductivity type formed within the semiconductor body and connected to the second terminal, and a sixth region of the second conductivity type formed within the semiconductor body and connected to the fifth region and the first region.

9. The device of claim 1, wherein the trigger element comprises an NMOS device in a grounded gate configuration.

10. The device of claim 1, wherein the trigger element comprises a PMOS device in a grounded drain configuration.

11. In an integrated circuit, a silicon rectifier for providing electrostatic discharge protection to another circuit element, comprising:
    a first well region of a first conductivity type formed within a semiconductor body;
    a first region of the first conductivity type formed within the first well region;
    a second region of a second conductivity type formed within the first well region;
    a second well region of the second conductivity type formed within the semiconductor body adjacent to the first well region;
    a third region of the first conductivity type formed within the second well region;
    a fourth region of the second conductivity type formed within the second well region; and
    isolation regions formed within the semiconductor body respectively isolating the second well region from the first well region, the second region from the first region, and the fourth region from the third region;
    wherein the second region is connected to a terminal of the other circuit element;
    the first, third and fourth regions are connected to a reference potential terminal;
    the second region, first well region and semiconductor body are dimensioned and configured to act as a first transistor having an emitter connected through the second region to the protected device terminal, a base connected through resistance of the first well region and the first region to the reference potential terminal, and a collector connected through resistance of the semiconductor body and the fourth region to the reference potential terminal; and the third region, second well region and first well region are dimensioned and configured to act as a second transistor having an emitter connected through the third region to the reference potential terminal, a base connected through the semiconductor body to the base of the first transistor, and a collector connected to the base of the first transistor;

whereby application of a voltage difference between the other circuit element terminal and the reference potential terminal of at least a trigger voltage level will switch the silicon rectifier by forward injection from a deactivated state to an activated state to divert current away from the other circuit element to the reference potential terminal through the silicon rectifier.

12. The silicon rectifier of claim 11, wherein the first and second well regions and first, second, third and fourth regions are also dimensioned and configured so that, after switching from the deactivated state to the activated state, the activated state will be maintained until the voltage difference falls below a holding voltage level less than the trigger voltage level.

13. The silicon rectifier of claim 12, further comprising a trigger element connected between the other circuit element terminal and the reference potential terminal configured and adapted for setting the trigger voltage level and/or the holding voltage level.

14. The silicon rectifier of claim 13, wherein the trigger element comprises a series of diodes.

15. The silicon rectifier of claim 13, wherein the trigger element comprises a gate-coupled MOS transistor.

16. The silicon rectifier of claim 13, wherein the trigger element comprises a MOS transistor, a capacitor and a resistor; the MOS transistor having one of a source or drain connected to the first region, the other of the source or drain connected to the reference potential terminal, and a gate; the capacitor is connected between the gate and one of the one or other of the source or drain; and the resistor is connected between the gate and the other of the one or other of the source or drain.

17. The silicon rectifier of claim 13, wherein the trigger element comprises a cascoded MOS transistor circuit having first and second MOS transistors; the first MOS transistor has one of a source or drain connected to the first region, a gate connected to a gate of the second MOS transistor, and the other of the source or drain connected to one of a source or drain of the second MOS transistor.

* * * * *